United States Patent [19]
Matero

[11] Patent Number: 5,752,172
[45] Date of Patent: May 12, 1998

[54] DISTRIBUTED TRANSMITTER OUTPUT POWER CONTROL CIRCUIT AND METHOD FOR A RADIO TELEPHONE

[75] Inventor: Jorma Matero, Oulu, Finland

[73] Assignee: Nokia Mobile Phones Limited, Salo, Finland

[21] Appl. No.: 696,582

[22] Filed: Aug. 16, 1996

[51] Int. Cl.$^6$ .................................................. H01Q 11/12
[52] U.S. Cl. ........................................ 455/127; 455/522
[58] Field of Search ................................. 455/127, 126, 455/571, 575, 522; 375/297

[56] References Cited

U.S. PATENT DOCUMENTS

| | | | |
|---|---|---|---|
| 4,636,741 | 1/1987 | Mitzlaff | 330/127 |
| 5,101,175 | 3/1992 | Vaisanen | 330/279 |
| 5,109,538 | 4/1992 | Ikonen et al. | 455/89 |
| 5,124,672 | 6/1992 | Kuisma | 332/103 |
| 5,152,004 | 9/1992 | Vaisanen et al. | 455/68 |
| 5,179,353 | 1/1993 | Miyake | 330/129 |
| 5,204,643 | 4/1993 | Verronen | 333/81 |
| 5,214,372 | 5/1993 | Vaisanen et al. | 324/95 |
| 5,230,091 | 7/1993 | Vaisanen | 455/88 |
| 5,241,694 | 8/1993 | Vaisanen et al. | 455/126 |
| 5,276,917 | 1/1994 | Vanhanen et al. | 455/89 |
| 5,291,150 | 3/1994 | Saarnimo et al. | 330/279 |
| 5,307,512 | 4/1994 | Mitzlaff | 455/123 |
| 5,392,460 | 2/1995 | Mattila et al. | 455/76 |
| 5,392,464 | 2/1995 | Pakonen | 455/155 |
| 5,404,585 | 4/1995 | Vimpari et al. | 455/155 |
| 5,432,473 | 7/1995 | Mattila et al. | 330/133 |
| 5,434,537 | 7/1995 | Kukkonen | 330/2 |
| 5,493,255 | 2/1996 | Murtojarvi | 330/296 |
| 5,606,285 | 2/1997 | Wang et al. | 455/126 |

*Primary Examiner*—Amelia Au
*Attorney, Agent, or Firm*—Perman & Geen, LLP

[57] ABSTRACT

Disclosed is a transmitter circuit (14) for use in radio telephone (10), the transmitter circuit including a power amplifier (17D) having an output coupled to an antenna (12) for transmitting an amplified modulated RF signal; a variable gain driver amplifier (17C) having an output coupled to an input of the power amplifier and an input coupled to an output of a modulator (14A), the variable gain driver amplifier being required to output the modulated RF signal within a predetermined dynamic power range having a maximum value; and at least one programmable gain amplifier (PGA1, PGA2) coupled in series between the output of the modulator and the input of the variable gain driver amplifier. The at least one programmable gain amplifier has a dynamic range selected for reducing the dynamic range requirement of the variable gain driver amplifier to be less than the predetermined dynamic power range. For example, the maximum predetermined dynamic range value is in excess of 60 dB, and a maximum dynamic range value of the variable gain driver amplifier is less than 50 dB (e.g., 40 dB to 44 dB).

15 Claims, 3 Drawing Sheets

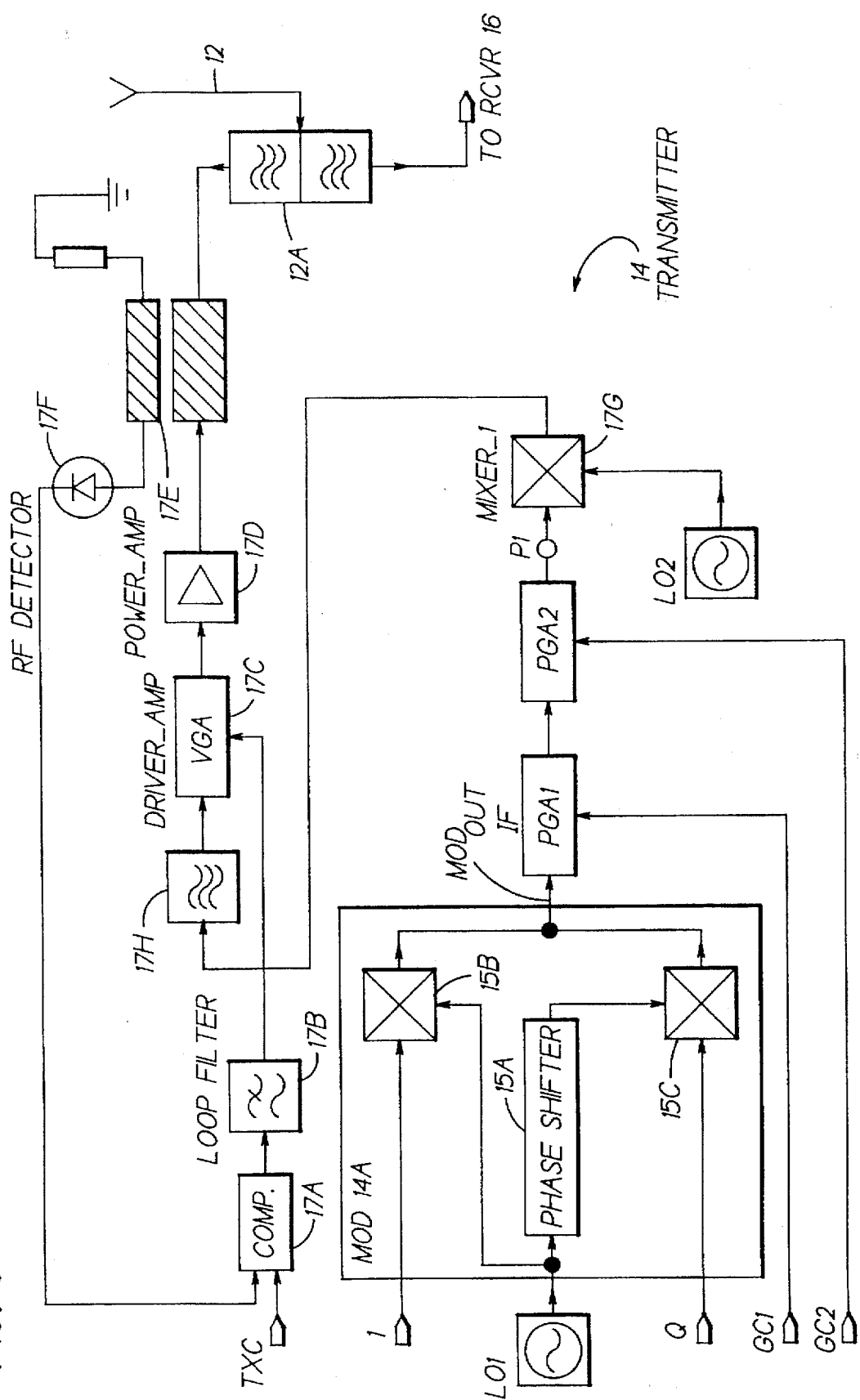

DISTRIBUTED TRANSMITTER OUTPUT POWER CONTROL CIRCUIT AND METHOD FOR A RADIO TELEPHONE

FIELD OF THE INVENTION

This invention relates generally to radio frequency (RF) transmitters and, in particular, for RF transmitters used in radio telephones, such as cellular telephones and personal communicator devices.

BACKGROUND OF THE INVENTION

In a dual mode mobile telephone (e.g., one capable of operation with both an analog (AMPS) and a digital standard), the π/4-DQPSK modulation that is needed when operating in the digital mode sets a high linearity requirement for the transmitter circuits that follow the π/4-DQPSK modulator.

A mobile telephone does not operate with a constant transmitter power level, but is instead transmitter power controlled as a function of, by example, a distance from a base station, propagation conditions, and, in a spread spectrum system, also by a number of users within a given cell.

However, conventional practice uses a single variable gain amplifier (VGA) driver stage between the output of the modulator and an input of a final power amplifier. This is not an optimum solution, since there are a number of variables that must be accommodated, such as component tolerance variations, amplifier stage full range power requirements, and amplifier stage power ramping requirements. Using the conventional approach, a single VGA driver having as much as a 60 dB dynamic range may be required, while still providing the stringent linearity required when operating in the digital (π/4-DQPSK modulation) mode.

OBJECTS OF THE INVENTION

It is a first object of this invention to provide an improved transmitter for a mobile station or radio telephone, such as a cellular telephone or a personal communicator.

It is a further object of this invention to provide an improved transmitter for a mobile station that employs a plurality of programmable gain amplifier stages, and that relaxes the typical 60 dB requirement of a VGA that precedes the power amplifier to a lesser value, such as 40 dB to 45 dB (i.e., less than 50 dB).

It is a further object of this invention to provide an improved transmitter for a mobile station that employs a plurality of programmable gain amplifier stages, wherein at least one programmable gain amplifier stage is employed to calibrate out component tolerances, thereby relaxing the dynamic range requirements of the final VGA.

It is another object of this invention to provide an improved transmitter for a mobile station that employs a plurality of programmable gain amplifier stages, wherein at least one gain controlled amplifier stage is employed to adjust an output power of the modulator, thereby extending the dynamic range of the transmitter power control function.

SUMMARY OF THE INVENTION

The foregoing and other problems are overcome and the objects of the invention are realized by methods and apparatus in accordance with embodiments of this invention, wherein at least one programmable gain amplifier stage is placed after a digital mode modulator and before a driver VGA, thereby distributing the gain control function over the transmitter chain, and relaxing the dynamic range requirements.

The inventor has realized that, to achieve an optimum solution to the transmitter gain control problem, it is important to provide an optimum gain distribution in the transmitter chain (i.e., in the circuitry from the output of the modulator to the input of the antenna). From a linearity point of view the inventor has further realized that an optimum position for the gain control function is immediately after the modulator.

This invention thus teaches an amplifier for a dual mode mobile station wherein the gain control function is distributed, and wherein a dynamic control range for a driver amplifier stage is significantly reduced. Other benefits that are obtained from the use of the teaching of this invention include: (a) an ability to compensate for or "tune out" transmitter chain gain tolerances; (b) an ability to obtain the same output power from the modulator in both the analog and digital modes; and (c) an improved power control loop performance.

In accordance with an aspect of this invention a modulator output level is controlled with one or more programmable gain amplifiers, and power regulation, with output level feedback, is performed with a variable gain driver amplifier having a reduced dynamic range, relative to the prior art implementations.

More particularly, this invention teaches a transmitter circuit for use in a radio telephone, the transmitter circuit including a power amplifier having an output coupled to an antenna for transmitting an amplified modulated RF signal; a variable gain driver amplifier having an output coupled to an input of the power amplifier and an input coupled to an output of a modulator, the variable gain driver amplifier being required to output the modulated RF signal within a predetermined dynamic power range having a maximum value; and at least one programmable gain amplifier coupled in series between the output of the modulator and the input of the variable gain driver amplifier. The at least one programmable gain amplifier has a dynamic range selected for reducing the dynamic range requirement of the variable gain driver amplifier to be less than the predetermined dynamic power range. For example, the maximum predetermined dynamic range value is in excess of 60 dB, and a maximum dynamic range value of the variable gain driver amplifier is less than 50 dB (e.g., 40 dB to 44 dB). In a further aspect of this invention, first and second programmable gain amplifiers are coupled in series between the output of the modulator and the input of the variable gain driver amplifier. In this case the first programmable gain amplifier has a first dynamic range that is adjustable in n steps, the second programmable gain amplifier has a second dynamic range that is adjustable in m steps, and n is greater than m. For example, in a presently preferred embodiment n is equal to 12, m is equal to 3, each of the n steps is equal to 1 dB, and each of the m steps is equal 12 dB.

This invention also teaches a novel method for calibrating a transmitter of a radio telephone, such as cellular telephone or personal communicator.

BRIEF DESCRIPTION OF THE DRAWINGS

The above set forth and other features of the invention are made more apparent in the ensuing Detailed Description of the Invention when read in conjunction with the attached Drawings, wherein:

FIG. 3 is a circuit block diagram of a presently preferred embodiment of the mobile station transmitter shown in FIG. 1.

DETAILED DESCRIPTION OF THE INVENTION

Figure 1:
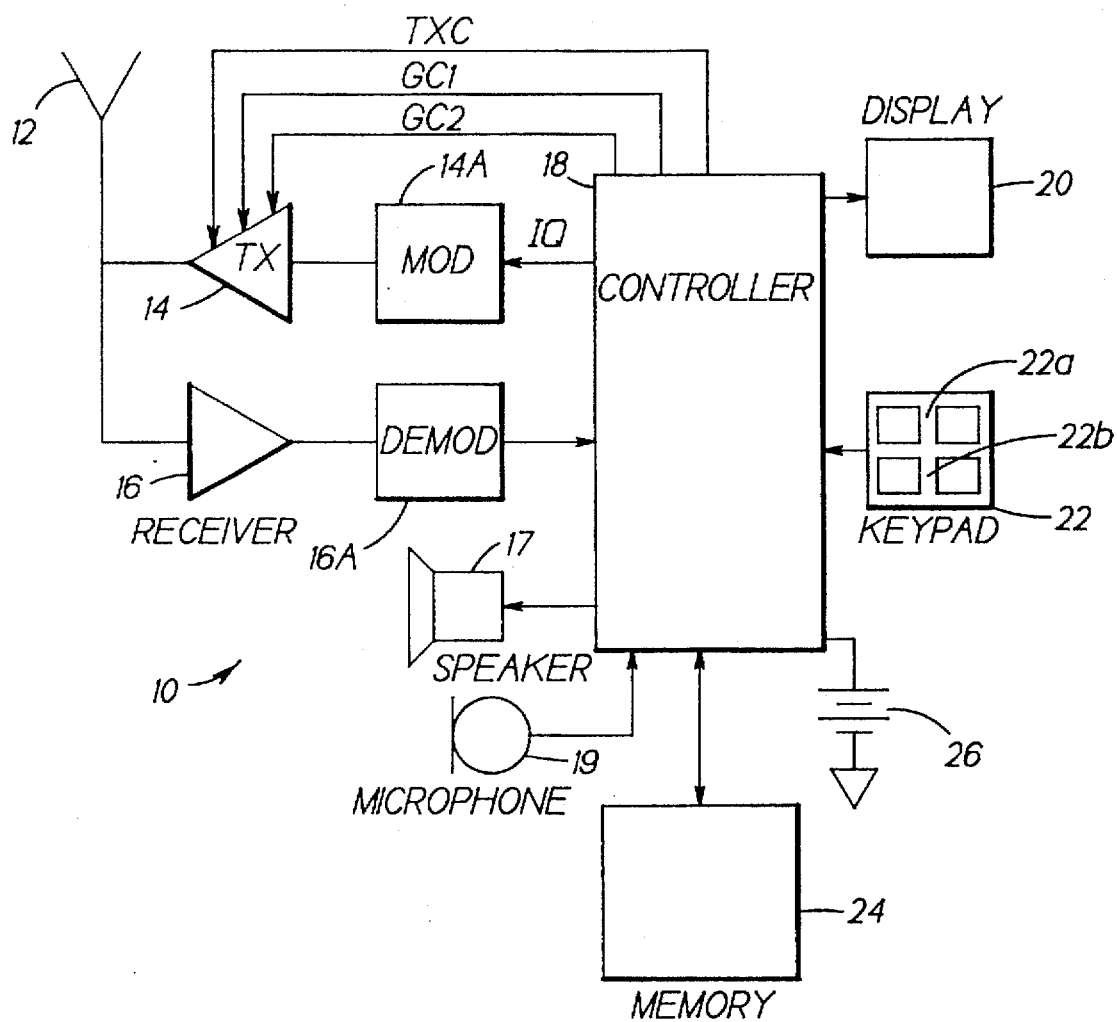
FIG. 1 is a block diagram of a mobile station that is constructed and operated in accordance with this invention.
Figure 2:
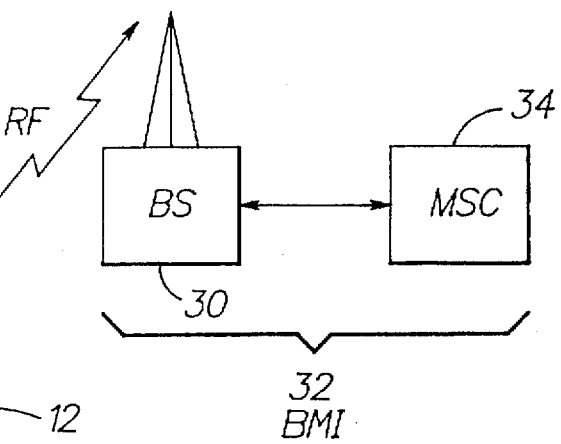
FIG. 2 is an elevational view of the mobile station shown in FIG. 1, and which further illustrates a cellular communication system.
Figure 2:
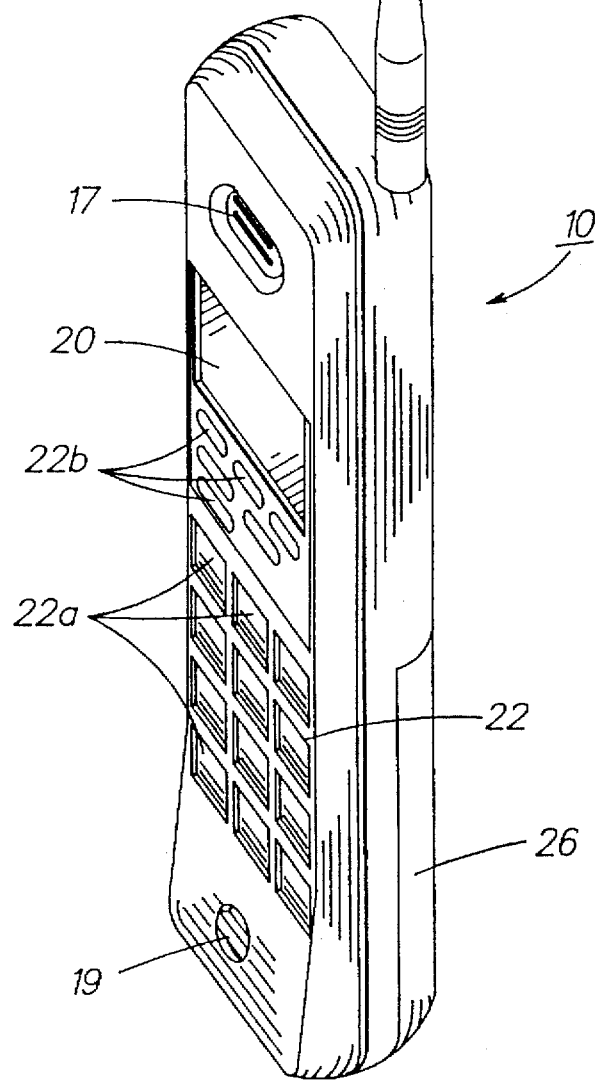

Reference is made to FIGS. 1 and 2 for illustrating a wireless user terminal or mobile station 10, such as but not limited to a cellular radiotelephone or a personal communicator, that is suitable for practicing this invention. The mobile station 10 includes an antenna 12 for transmitting signals to and for receiving signals from a base site or base station 30. The base station 30 is a part of a cellular network comprising a base station/mobile switching center/ internetworking function, or BMI 32, that includes a Mobile Switching Center (MSC) 34. The MSC 34 provides a connection to landline trunks when the mobile station 10 is involved in a call.

The mobile station includes a modulator (MOD) 14A, a transmitter 14 (described in further detail below and in FIG. 3), a receiver 16, a demodulator (DEMOD) 16A, and a controller 18 that provides signals to and receives signals from the transmitter 14 and receiver 16, respectively. These signals include signalling information in accordance with the air interface standard of the applicable cellular system or systems, and also user speech and/or user generated data. The air interface standard is assumed for this invention to include at least a digital format, such as that described in IS-136, although the teaching of this invention is not intended to be limited for use only with an IS-136 compatible mobile station, or for use only in TDMA type systems.

A user interface includes a conventional earphone or speaker 17, a conventional microphone 19, a display 20, and a user input device, typically a keypad 22, all of which are coupled to the controller 18. The keypad 22 includes the conventional numeric (0–9) and related keys (#,*) 22a, and other keys 22b used for operating the mobile station 10. These other keys 22b may include, by example, a SEND key, various menu scrolling and soft keys, and a PWR key. The mobile station 10 also includes a battery 26 for powering the various circuits that are required to operate the station.

The mobile station 10 also includes various memories, shown collectively as the memory 24, wherein are stored a plurality of constants and variables that are used by the controller 18 during the operation of the mobile station. For example, the memory 24 stores the values of various cellular system parameters and the number assignment module (NAM). An operating program for controlling the operation of controller 18 is also stored in the memory 24 (typically in a ROM device). The memory 24 may also store data, including user messages, that is received from the BMI 32 prior to the display of the messages to the user.

It should be understood that the mobile station 10 can be a vehicle mounted or a handheld device. It should further be appreciated that the mobile station 10 can be capable of operating with one or more air interface standards, modulation types, and access types. By example, the mobile station may be capable of operating with any of a number of other standards besides IS-136, such as GSM, DCT, PDC, and IS-95 (CDMA). Dual mode narrow-band AMPS (NAMPS), as well as TACS, mobile stations may also benefit from the teaching of this invention. It should thus be clear that the teaching of this invention is not to be construed to be limited to any one particular type of mobile station or air interface standard.

Reference is now made to the block diagram of FIG. 3 for illustrating a presently preferred embodiment of the transmitter 14. Also illustrated is a digital portion of the modulator 14A which, for the purposes of this invention, can be considered as being conventional in construction and operation. That is, the modulator 14A has inputs for receiving In-phase and Quadrature (I/Q) signals and a first local oscillator (LO1) signal. The modulator 14A includes a phase shifter 15A, a first mixer 15B, and a second mixer 15C. An output of the modulator ($MOD_{OUT}$) is a $\pi/4$-DQPSK modulated speech, data or signalling information signal that is intended to be transmitted to the base station 30 of FIG. 2.

The transmitter 14 includes a closed power control loop circuit comprising an input transmitter power control (TXC) signal, a comparator 17A, a loop filter 17B, a driver VGA 17C whose output is controlled by the filtered comparator signal, a power amplifier 17D, an output coupler 17E, and a RF detector 17F. In operation, the TXC signal is compared to the output of the RF detector 17F. If the RF detector output is higher than TXC, then the output of the comparator 17A is low. Conversely, if the RF detector output is lower than TXC, then the output of the comparator 17A is high. The output of coupler 17E is applied to a duplex filter 12A and then the antenna 12. The TXC signal may be generated by the controller 18 of FIG. 1. This portion of the transmitter 14 may be conventional in construction, except for a relaxed dynamic range requirement of the driver VGA 17C, as described below.

In the digital mode the nominal power levels of 2 through 10 set a control range requirement of 32 dB (the analog mode power level requirements are typically 2–7). Additionally, there should be at least 33 dB reserved for power ramping and transmitter gain variations due to component tolerances and environmental temperature.

In accordance with the teaching of this invention, any gain variation due to component tolerances in the modulator 14A and the transmitter chain are compensated for with a first programmable gain amplifier PGA1. PGA1 is controlled by a first gain control (GC1) signal. A suitable control range for PGA1 is from 0 dB to 12 dB, depending on the implementation, and is preferably controlled in 1 dB steps. The GC1 signal can be either analog or digital, however, improved accuracy is achieved through the use of the digital control signal. GC1 may also be sourced by the controller 18 of FIG. 1. It is noted that PGA1 can also be used to set $MOD_{OUT}$ to the same level in either the analog or digital modes of operation.

By example, in some embodiments of this invention the modulator 14A can also be used to generate a frequency modulated (FM) signal when operating in the analog mode, as is described in commonly assigned U.S. Pat. No. : 5,124,672, entitled "Combined Analog/Digital Frequency Modulator", by Erkki Kuisma. In further embodiments of the invention the modulator 14A can generate the FM signal in a manner similar to that described in, by example, commonly assigned U.S. Pat. No. : 5,392,460, entitled "Dual Mode Radiotelephone Terminal Selectively Operable for Frequency Modulated or Phase Modulated Operation" by Heikki Mattila, Jorma Matero, and Jaakko Hulkko. The disclosures of these two commonly U.S. Patents are incorporated by reference herein in their entireties.

Further in accordance with this invention, a second programmable gain amplifier (PGA2) can be employed to divide the transmitter power level control into, by example, three sub-ranges. PGA2 thus has three gain steps, namely 0 dB, –12 dB and –24 dB. In other embodiments more or less than three gain steps can be used, while in other embodiments the gains steps may have different values than 0 dB, −12 dB and −24 dB. The gain of PGA2 is controlled by a second gain control signal GC2, also sourced from the controller 18.

It is also within the scope of the teaching of this invention to employ but one PGA, instead of the two PGAs illustrated in FIG. 3.

As can be seen in FIG. 3, the PGA1 and PGA2 are series connected between the output of the modulator 14A and an up-conversion mixer 17G. Mixer 17G receives a second local oscillator signal (LO2) and mixes the gain controlled $MOD_{OUT}$ signal to the final transmission frequency. The output of mixer 17G is applied to bandpass filter 17H, and then to the driver VGA 17C.

It should be noted that in the single modulator case the LO1 signal may be operated at the transmission frequency, thereby eliminating the need for LO2 and the up-conversion mixer 17G. In this case the output of PGA2 can be coupled directly to the band pass filter 17H.

Illustrative PGA1 and PGA2 gain values vs. output power levels for a typical dual mode digital/analog (DAMPS) system are shown below in the Table.

TABLE

| Power level | Antenna RF power [dBm] | | GC1 value [dB] | | GC2 value [dB] | |
|---|---|---|---|---|---|---|
| | Analog mode | Digital mode | Analog mode | Digital mode | Analog mode | Dig. mode |
| 2 | 28 | 28 | calib. value | calib. value with mode correction | 0 | 0 |
| 3 | 24 | 24 | calib. value | calib. value with mode correction | 0 | 0 |
| 4 | 20 | 20 | calib. value | calib. value with mode correction | 0 | 0 |
| 5 | 16 | 16 | calib. value | calib. value with mode correction | −12 | −12 |
| 6 | 12 | 12 | calib. value | calib. value with mode correction | −12 | −12 |
| 7 | 8 | 8 | calib. value | calib. value with mode correction | −12 | −12 |
| 8 | — | 4 | — | calib. value with mode correction | — | −24 |
| 9 | — | 0 | — | calib. value with mode correction | — | −24 |
| 10 | — | −4 | — | calib. value with mode correction | — | −24 |

As is apparent, with the distributed gain of the transmitter chain that is a feature of this invention, the driver VGA 17C requires only an approximately 40 dB to 45 dB dynamic control range, which is about 20 dB less than is required in a conventional transmitter gain control approach.

The GC1 calibration can be performed as follows in order to avoid an interference from the RF detector 17F and the driver VGA 17C.

1. The TXC power level control signal is set for a maximum power level.

2. The GC1 signal is set for mid-range value, for example 6 dB.

3. The GC2 signal is set for −12 dB.

4. For convenience, the operating mode is set to the analog mode (i.e., for FM modulation) because of the absence of a slot structure and the presence of a constant envelope. However, tuning can also be accomplished by setting the operating mode of the modulator 14A to the digital mode.

5. The modulator 14A and transmitter 14 are turned on.

6. The RF power at the connector to antenna 12 is measured.

7. The measured power is compared to a predetermined value corresponding to a power level that should be achieved with a nominal gain budget, and a difference value is determined.

8. A calibration value for GC1 is calculated so as to compensate the determined power difference value. This calibration value can then be stored in the memory 24, and thereafter accessed and supplied to PGA1 by the controller 18 when the transmitter is to be used.

In this calibration method the output level of the modulator 14A is low enough to keep the voltage detected by the RF detector 17F below the TXC value (at comparator 17A), and thus the driver amplifier (VGA) is set for maximum gain (i.e., the gain specified by TXC). In this manner it is possible to measure the maximum gain of the transmitter chain. During actual power level tuning the GC2 signal is set for 0 dB gain, and the closed loop power control is restored. The power levels are thereafter tuned as with a conventional system, except that the value of the GC2 signal is changed as the power level is changed, as is shown in the Table.

A number of advantages arise from the use of the teaching of this invention. A first advantage is that the gain control slope of the driver VGA 17C can be made more linear, which improves the power control loop ramp up. A second advantage is that the gain control dynamic range of the driver VGA 17C is reduced over that required in convention systems (e.g., to a range of about 40 dB to 45 dB). A third advantage is that noise at the output ($MOD_{OUT}$) of the modulator 14A, at the low power level, is reduced. A fourth advantage is that the transmitter gain and power control in accordance with this invention is compatible with the requirements of modern cellular and personal communicator system specifications.

While the invention has been particularly shown and described with respect to preferred embodiments thereof, it will be understood by those skilled in the art that changes in form and details may be made therein without departing from the scope and spirit of the invention.

What is claimed is:

1. A transmitter circuit for use in a radio telephone, comprising:
   a power amplifier having an output coupled to an antenna for transmitting an amplified modulated RF signal;
   a variable gain driver amplifier having an output coupled to an input of said power amplifier and an input coupled to an output of a modulator, said variable gain driver amplifier being required to output the modulated RF signal within a predetermined dynamic power range having a maximum value; and
   at least one programmable gain amplifier coupled in series between said output of said modulator and said input of said variable gain driver amplifier, wherein said at least one programmable gain amplifier has a dynamic range selected for reducing the dynamic range requirement of said variable gain driver amplifier to be less than the maximum value of the predetermined dynamic power range.

2. A transmitter circuit as set forth in claim 1, wherein said maximum value of said predetermined dynamic range is in excess of 60 dB, and wherein a maximum value of said dynamic power range of said variable gain driver amplifier is less than 50 dB.

3. A transmitter circuit for use in a radio telephone, comprising:
   a power amplifier having an output coupled to an antenna for transmitting an amplified modulated RF signal;
   a variable gain driver amplifier having an output coupled to an input of said power amplifier and an input coupled to an output of a modulator, said variable gain driver amplifier being required to output the modulated RF signal within a predetermined dynamic power range having a maximum value; and
   first and second programmable gain amplifiers coupled in series between said output of said modulator and said input of said variable gain driver amplifier, said first programmable gain amplifier having a first dynamic range that is adjustable in n steps, said second programmable gain amplifier having a second dynamic range that is adjustable in m steps, and wherein n is greater than m.

4. A transmitter circuit as set forth in claim 3, wherein n is equal to 12, and wherein m is equal to 3.

5. A transmitter circuit as set forth in claim 3, wherein each of the n steps is equal to 1 dB, and wherein each of the m steps is equal 12 dB.

6. A transmitter circuit as set forth in claim 3, wherein said first and second programmable gain amplifiers have a cumulative dynamic range selected for reducing the dynamic range requirement of said variable gain driver amplifier to be less than the maximum value of the predetermined dynamic power range.

7. A transmitter circuit as set forth in claim 6, wherein said maximum value of said predetermined dynamic range is in excess of 60 dB, and wherein a maximum value of said dynamic range of said variable gain driver amplifier is less than 50 dB.

8. A mobile station having an antenna coupled to an input of a receiver and to an output of a transmitter, a modulator having an output coupled to an input of said transmitter for providing a modulated RF signal to said transmitter, and a controller, said transmitter comprising:
   a power control loop comprised of a power amplifier having an input coupled to an output of a variable gain driver amplifier, said variable gain amplifier having a control input for receiving a transmitter power control signal, a power sensor and detector coupled to an output of said power amplifier, and a circuit for comparing a maximum transmitted power control signal to an output of the detector for limiting a value of control signal applied to said variable gain driver amplifier; and
   at least one programmable gain amplifier having an input coupled to said modulator output and an output coupled to an input of said variable gain driver amplifier, said at least one programmable gain amplifier having a dynamic range that is wide enough to compensate for variations in gain that are caused by component tolerances in at least said modulator and said power control loop.

9. A mobile station as set forth in claim 8, wherein said transmitter is comprised of first and second programmable gain amplifiers coupled in series between said output of said modulator and said input of said variable gain driver amplifier, said first programmable gain amplifier having a first dynamic range that is adjustable in n steps, said second programmable gain amplifier having a second dynamic range that is adjustable in m steps, and wherein n is greater than m.

10. A mobile station as set forth in claim in claim 9, wherein n is equal to 12, and wherein m is equal to 3.

11. A mobile station as set forth in claim 9, wherein each of the n steps is equal to 1 dB, and wherein each of the m steps is equal 12 dB.

12. A mobile station as set forth in claim 9, wherein said first and second programmable gain amplifiers have a cumulative dynamic range selected for reducing a dynamic range requirement of said variable gain driver amplifier to be less than a predetermined maximum dynamic power range.

13. A mobile station as set forth in claim 12, wherein said predetermined maximum dynamic range is in excess of 60 dB, and wherein a maximum value of said dynamic range of said variable gain driver amplifier is less than 50 dB.

14. A method of calibrating a transmitter circuit in a radio telephone, comprising the steps of:
   providing the transmitter circuit so as to include a power amplifier having an output coupled to an antenna, a variable gain driver amplifier coupled to an input of the power amplifier, and at least one programmable gain amplifier coupled between an output of a modulator and an input of the variable gain driver amplifier;
   setting a gain of the variable gain driver amplifier to a maximum level;
   setting a gain of the at least one programmable gain amplifier to a mid-level;
   measuring a power level at the output of the power amplifier;

comparing the measured power level to an expected power level; and adjusting the gain of the at least one programmable gain amplifier to an adjusted value so as to bring the measured power level into agreement with the expected power level.

15. A method as set forth in claim 14, and further comprising a step of storing, in the radio telephone, an indication of the adjusted value for subsequent use during the operation of the radio telephone.

* * * * *